US009112081B2

United States Patent
Kataoka

(10) Patent No.: US 9,112,081 B2
(45) Date of Patent: *Aug. 18, 2015

(54) SEALING FILM FOR SOLAR CELL AND SOLAR CELL OBTAINED BY USE OF THE SEALING FILM

(75) Inventor: Hisataka Kataoka, Yokohama (JP)

(73) Assignee: BRIDGESTONE CORPORATION, Tokyo (JP)

( * ) Notice: Subject to any disclaimer, the term of this patent is extended or adjusted under 35 U.S.C. 154(b) by 897 days.

This patent is subject to a terminal disclaimer.

(21) Appl. No.: 12/921,100

(22) PCT Filed: Mar. 4, 2009

(86) PCT No.: PCT/JP2009/054080
§ 371 (c)(1),
(2), (4) Date: Sep. 3, 2010

(87) PCT Pub. No.: WO2009/110511
PCT Pub. Date: Sep. 11, 2009

(65) Prior Publication Data
US 2011/0005592 A1    Jan. 13, 2011

(30) Foreign Application Priority Data
Mar. 5, 2008  (JP) ................. 2008-054881

(51) Int. Cl.
*C08K 5/524* (2006.01)
*C08K 3/22* (2006.01)
*H01L 31/048* (2014.01)
(Continued)

(52) U.S. Cl.
CPC ........ *H01L 31/048* (2013.01); *B32B 17/10018* (2013.01); *B32B 17/10623* (2013.01); *B32B 17/10678* (2013.01); *B32B 17/10788* (2013.01);
*C08K 3/0033* (2013.01); *C08K 5/0025* (2013.01); *C08K 5/524* (2013.01); *C08L 23/0853* (2013.01); *B32B 2367/00* (2013.01); *C08K 2003/2241* (2013.01); *C08K 2201/003* (2013.01); *Y02E 10/50* (2013.01)

(58) Field of Classification Search
None
See application file for complete search history.

(56) References Cited

U.S. PATENT DOCUMENTS 5,660,645 A * 8/1997 Mori et al. ............ 136/251
5,973,258 A * 10/1999 Shiotsuka et al. ........ 136/252
(Continued)

FOREIGN PATENT DOCUMENTS

GB    1272867    5/1972
JP    06-177412 A    6/1994
(Continued)

OTHER PUBLICATIONS

Extended European Search Report issued Mar. 22, 2012 in European Patent Application No. 09718546.6.
(Continued)

*Primary Examiner* — Robert C Boyle
*Assistant Examiner* — Stephen Rieth
(74) *Attorney, Agent, or Firm* — Sughrue Mion, PLLC

(57) ABSTRACT

A sealing film having excellent adhesive characteristics for a solar cell is provided, which contains an inorganic filler in the sealing film. The sealing film for a solar cell contains ethylene-polar monomer copolymer, a crosslinking agent, and an inorganic filler. The sealing film is characterized by further containing a phosphite compound represented by formula (I): $P(OR_1)^3$ (I) (wherein R1 is a hydrocarbon group having 1 to 20 carbon atoms).

9 Claims, 1 Drawing Sheet

(51) Int. Cl.
*C08L 31/04* (2006.01)
*B32B 17/10* (2006.01)
*C08K 3/00* (2006.01)
*C08K 5/00* (2006.01)
*C08L 23/08* (2006.01)

(56) References Cited

U.S. PATENT DOCUMENTS

| | | | |
|---|---|---|---|
| 6,093,757 A | 7/2000 | Pern | |
| 6,130,379 A | 10/2000 | Shiotsuka et al. | |
| 6,323,416 B1* | 11/2001 | Komori et al. | 136/259 |
| 8,791,182 B2* | 7/2014 | Ikeda et al. | 524/147 |
| 2001/0045229 A1* | 11/2001 | Komori et al. | 136/251 |
| 2002/0038664 A1* | 4/2002 | Zenko et al. | 136/251 |
| 2004/0202866 A1 | 10/2004 | Kernander et al. | |

FOREIGN PATENT DOCUMENTS

| | | |
|---|---|---|
| JP | 06-322334 A | 11/1994 |
| JP | 07-202243 A | 8/1995 |
| JP | 07-247468 A | 9/1995 |
| JP | 08-316508 A | 11/1996 |
| JP | 09-092759 A | 4/1997 |
| JP | 11-163377 A | 6/1999 |
| JP | 2006-36874 A | 2/2006 |

OTHER PUBLICATIONS

F.J. Pern, "Development of New EVA Formulations for Improved Performance at NREL", AIP Conference Proceedings, American Institute of Physics, New York, US, Jan. 1, 1997, pp. 795-810 (XP002916925).

Machine-generated English translation of JP 06-177412 to Bridgestone Corp. published Jun. 24, 1994.

Machine-generated English translation of JP 08-316508 to Du Pont Mitsui Polychem Co., Ltd. published Nov. 29, 1996.

Machine-generated English translation of JP 09-092759 to Canon Inc. published Apr. 4, 1997.

Machine-generated English translation of JP 2006-036874 to Du Pont Mitsui Polychem Co. Ltd. published Feb. 9, 2006.

Machine-generated English translation of JP 07-247468 to Daicel Chem Ind. Ltd. published Sep. 26, 1995.

Machine-generated English translation of JP 06-322334 to Du Pont Mitsui Polychem Co. Ltd. published Nov. 22, 1994.

Machine-generated English translation of JP 07-202243 to Bridgestone Corp. published Aug. 4, 1995.

Machine-generated English translation of JP 11-163377 to Sharp Corp. published Jun. 18, 1999.

Communication in European Patent Application No. 09 718 546.6 issued Apr. 19, 2013 to Bridgestone Corporation.

* cited by examiner

SEALING FILM FOR SOLAR CELL AND SOLAR CELL OBTAINED BY USE OF THE SEALING FILM

CROSS REFERENCE TO RELATED APPLICATIONS

This application is a National Stage of International Application No. PCT/JP2009/054080, filed on Mar. 4, 2009, which claims priority from Japanese Patent Application No. 2008-054881, filed on Mar. 5, 2008, the contents of all of which are incorporated herein by reference in their entirety.

FIELD OF THE INVENTION

The present invention relates to a sealing film for a solar cell comprising, as a main component, ethylene-polar monomer copolymer, in particular to a sealing film including an inorganic filler and provides an excellent adhesive property.

BACKGROUND ART

In recent years, a solar cell, that is, a device that directly converts solar energy into electric energy has become widely used. Such solar cells provide an effective use of natural resources and prevent environmental pollution. Further development of solar cells is in progress.

Figure 1:
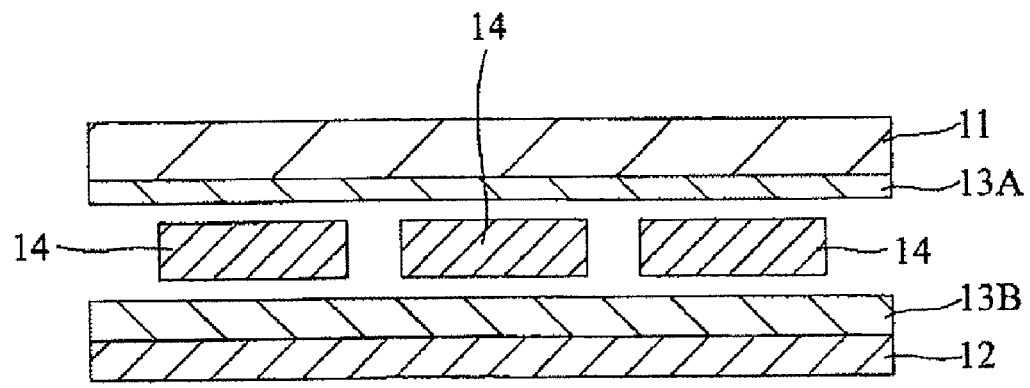

As shown in FIG. 1, a solar cell generally includes a front side transparent protection member 11, a front side sealing film 13A, photovoltaic cells 14 such as power generation elements made of silicon, a back side sealing film 13B, and a back side protection member (back cover) 12. The forgoing elements are successively superimposed in this order. After the solar cell is subjected to vacuum degassing, heat and pressure are applied to the solar cell so that the front side sealing film 13A and back side sealing film 13B are adhesively integrated with each other by crosslinking or curing the films 13A and 13B. Known solar cells are prepared by connecting a plurality of photovoltaic cells 14 with each other for generating a large electrical output. To maintain the electrical insulation property of the photovoltaic cells 14, the sealing layers 13A and 13B are provided with electrical insulation properties for sealing the photovoltaic cells 14.

Films of ethylene-polar monomer copolymer such as ethylene-vinyl acetate copolymer (EVA) and ethylene-ethyl acrylate copolymer (EEA) are used as sealing films in solar cells (Patent literature 1). The ethylene-polar monomer film is prepared by application of heat and pressure by use of rollers, to a composition comprising ethylene-polar monomer copolymer and a crosslinking agent.

Depending on the properties required for the solar cells, various fillers are used in the sealing films of the solar cells. For instance, when the back side sealing film colored by a pigment is used, light reflection occurs at an interface between the back side sealing film and the light-receipt side (front side) sealing film, or diffused light reflection occurs due to the presence of pigment in the back side sealing film. Namely, an incident light is irradiated to parts between the photovoltaic cells and light is transmitted through the cells. These lights are subjected to the diffused light reflection, and the diffused light enters the photovoltaic cells again as incident light. Accordingly, efficiency for using light, and power generation capability are improved. By use of pigments, an aesthetic or design property of the sealing film can be also improved. As the pigments, in general, various inorganic or organic pigments such as white, black, blue, red or the like are used. More specifically, for example, white pigments based on titanium oxide or calcium carbonate; blue pigments based on ultramarine; black pigments based on carbon black; and translucent pigments such as glass beads and a light scattering agent are used.

Patent Literature 1: JP-A 06 (1994)-177412

DISCLOSURE OF THE INVENTION

Problems to be Solved by the Invention

Conventional sealing films including inorganic fillers such as titanium oxide pigments have poor adhesive properties between the surface side transparent protection member and the back side protective member. It is possible that bubbles are generated or peeling occurs at an interface between the front or back side sealing film and the front or back side transparent protective member in a sealing film having a low adhesive property, when heat and pressure are applied to the solar cell during the preparation thereof, or when the solar cell is set outdoors.

When bubbles or pealing occurs, water penetrates the interface between the sealing film and the protection member, and the insulation property of the solar cell is decreased. Further, in this case, the steam barrier or gas barrier properties of the protection member may be damaged. Consequently, power generation capability of the solar cell is decreased. On the other hand, it is desired for solar cells to continue to have excellent power generation capability for a long time, e.g., for several decades or more from the time of installation.

It is therefore an object of the present invention to provide a sealing film for a solar cell having an excellent adhesive property, which includes an inorganic filler.

Means for Solving the Problems

When a sealing film for a solar cell includes an inorganic filler, the surface of the inorganic filler will be rough. Especially when the dispersibility of the inorganic filler is low, a film surface with irregular roughness is obtained. Based on the irregularity, the adhesive property of the sealing film of the solar cell is decreased, and hence bubble formation or pealing can be observed at an interface between the sealing film and the protection member. The inventors of the present invention studied variously and found that the dispersibility of an inorganic filer can be improved in the presence of a particular phosphite compound. Thus, it is possible to obtain a sealing film with an excellent adhesive property.

The above object is attained by a sealing film for a solar cell of the present invention, comprising ethylene-polar monomer copolymer, a crosslinking agent, an inorganic filler and a phosphite compound of following formula (I)

[Formula I]

$$P(OR^1)_3 \qquad (I)$$

(wherein, $R^1$ is a hydrocarbon having 1 to 20 carbon)

Preferred embodiments of the sealing film for a solar cell of the present invention will now be discussed below.

(1) The phosphite compound is included in an amount of 0.01 to 5 parts by weight, based on 100 parts by weight of ethylene-polar monomer copolymer.
(2) The ethylene-polar copolymer is ethylene-vinyl acetate copolymer.
(3) The inorganic filler is a white inorganic pigment.

Effect of the Invention

The sealing film for a solar cell of the present invention has an excellent adhesive property, due to the presence of the phosphite compound of the above formula (I). Therefore, in the sealing film for a solar cell of the present invention, it is possible to prevent the interface between the sealing film and the protection member from forming bubbles and peeling off of layers from each other. In other words, the solar cell obtained in the invention maintains a large electrical power generation capability for a long time from the time of installation.

BRIEF DESCRIPTION OF DETAILED EXPLANATION

Figure 2:
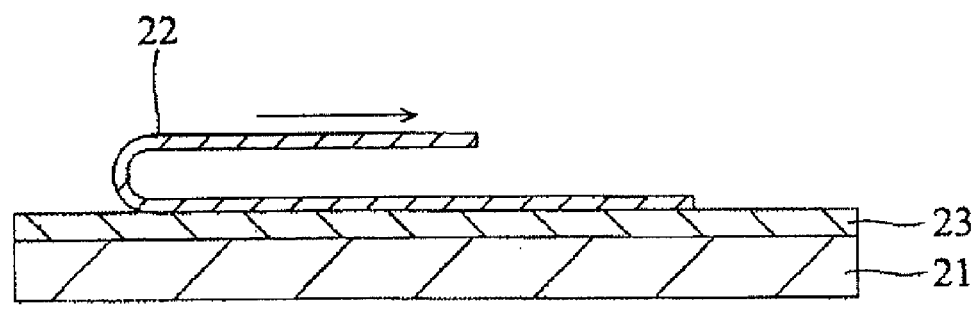

FIG. 1 is a cross section of a generally used solar cell.
FIG. 2 is a schematic diagram for explaining 180° peel test.

EXPLANATION OF REFERENCE NUMERALS

11,12 Front side transparent protection member
12, 22 Back side protection member
13A Front side sealing film
13B Back side sealing film
14 Photovoltaic cell
26 Sealing film for determining quantity of acetic acid generation
21 Glass substrate
22 Sealing film for solar cell
23 PET film

BEST MODE FOR CARRYING OUT THE INVENTION

A sealing film for a solar cell of the present invention comprises a phosphite compound, in addition to ethylene-polar monomer copolymer, crosslinking agent, and inorganic filler.
(Phosphite Compound)
The phosphite compound has a phosphor atom and three straight- or branched-chain hydrocarbon groups connected to the phosphor atom via an oxygen atom.
As the phosphite compound, the compound of the following formula (I) is preferably used:

[Formula 2]

$$P(OR^1)_3 \qquad (I)$$

(wherein, R1 is a hydrocarbon group having 1 to 20 carbon atoms).

Secondary phosphite compound represented by $(HO)P(OR^2)_2$ is also known, wherein $R^2$ is a hydrocarbon group having 1 to 20 carbon atoms. The secondary phosphite compound, however, is easily hydrolyzed, e.g., to phosphonic acid. Namely, a sealing film for a solar cell having an excellent adhesive property cannot be obtained. On the other hand, it is possible to provide a sealing film for a solar cell, which has an excellent adhesive property, by using the tertiary phosphite compound as shown in the above-mentioned formula (I).

In formula (I), $R^1$ is a hydrocarbon group having 1 to 20 carbon atoms. Each of $R^1$ can be the same or different from each other. More specifically, alkyl groups, aryl groups, aralkyl groups can be preferably used.

As the alkyl groups, straight- or branched-chain alkyl groups such as methyl group, ethyl group, n-propyl group, iso-propyl group, tert-butyl group, iso-butyl group, n-butyl group, sec-butyl group, hexyl group, n-octyl group, iso-octyl group, n-decyl group, iso-decyl group, n-dodecyl group, iso-dodecyl group, n-tridecyl group, iso-tridecyl group, n-tetradecyl group, n-hexadecyl group, iso-hexadecyl group, stearyl group, nonadecyl group or the like can be used.

As the aryl group, phenyl group, nonylphenyl group, 4-propylphenyl group, 4-pentylphenyl group, 4-octylphenyl group, 4-methoxyphenyl group, 4-propoxyphenyl group, 4-penthyloxyphenyl group, 4-octyloxyphenyl group, 4-butoxymethylphenyl group, 4-octyloxyethylphenyl group, 4-butoxyethoxyphenyl group, 4-octyloxyethoxyphenyl group, 4-butoxybutoxyphenyl group or the like can be used.

As the aralkyl group, benzyl group, phenethyl group, phenylpropyl group, phenylbutyl group, phenylhexyl group or the like can be used.

Among the hydrocarbons having 1 to 20 carbon atoms for $R^1$ discussed above, it is preferable to use straight- or branched-chain alkyl group having 6 to 18 carbon atoms, more preferably having 8 to 14 carbon atoms. In particular, branched-chain aliphatic alkyl groups are preferably used. Specifically, it is preferable to use iso-decyl group, iso-dodecyl group, iso-tridecyl group, iso-tetredecyl group, and iso-hexadecyl groups. When $R^1$ is such hydrocarbon group, it is possible to disperse an inorganic filler in the sealing film, without having bleed out phenomenon from the sealing film when the solar cell is stored.

Specific examples of the phosphite compound are tri-arylphosphite such as triphenyl phosphate or tri(nonylphenyl)phosphate; alkyl-aryl phosphite such as diphenylisooctyl phosphite, diphenylisodecyl phosphite, diisodecylphenyl phosphite, diisooctyloctylphenyl phosphite, phenyl neopentylglycol phosphite, or 2,4,6-tri-t-butylphenyl-(2-butyl-2-ethyl-1,3-propanediol) phosphite; and trialkyl phosphite such as trisisodecyl phosphite, trilauryl phosphite or tris(tridecyl) phosphite. Among these, trisisodecyl phosphite is preferably used. This is because trisisodecyl phosphite is excellent for highly dispersing an inorganic filler, and then for obtaining a sealing film with an excellent adhesive property. Moreover, trisdecyl phosphite is a safe material which it is not an environmental hormone material.

The content of the phosphite compound of formula (I) in the sealing film of the present invention is preferably in the range of 0.01 to 5 parts by weight, more preferably in the range of 0.1 to 1 part by weight, and particularly preferably in the range of 0.1 to 0.5 parts by weight, based on 100 parts by weight of ethylene-polar monomer. Accordingly, a sealing film can be obtained, which has a good dispersibility of inorganic fillers and an excellent adhesive property.
(Ethylene-Polar Monomer Copolymer)
Examples of the polar monomer used for the ethylene-polar monomer copolymer used in the sealing film of the present invention are unsaturated carboxylic acids, salts thereof, esters thereof, and amides thereof, vinyl esters, and carbon monoxide. Specific examples of the monomer are unsaturated carboxylic acids such as acrylic acid, methacrylic acid, fumaric acid, itaconic acid, monomethyl maleate, monoethyl maleate, maleic anhydride, and itaconic anhydride, salts of these unsaturated carboxylic acids, such as monovaleic metal salts such as lithium, sodium and potassium salts of the carboxylic acids, and polyvaleic metal salts such as magnesium, calcium, and zinc salts of the carboxylic acids; and unsaturated carboxylic esters such as methyl acrylate, ethyl acrylate, isopropyl acrylate, isobutyl acrylate, n-butyl acrylate, isooctyl acrylate, methyl methacrylate, ethyl methacrylate, isobutyl methacrylate, and dimethyl maleate; and vinyl esters such as vinyl acetate, vinyl propionate, and carbon monoxide and sulfur dioxide. One, two or more of the above-mentioned monomers can be used.

More specifically, representative examples of the ethylene-polar monomer copolymer are ethylene-unsaturated carboxylic acid copolymer such as ethylene-acrylic acid copolymer, and ethylene-methacrylic acid copolymer; ionomers which are obtained by partially or entirely neutralizing carboxylic group of the above-mentioned ethylene-unsaturated carboxylic acid copolymer by using the above-mentioned metals; ethylene-unsaturated carboxylate copolymers such as ethylene-methyl acrylate copolymer, ethylene-ethyl acrylate copolymer, ethylene-methyl methacrylate copolymer, ethylene-isobutyl acrylate copolymer, ethylene-n-butylacrylate copolymer; ethylene-unsaturated carboxylate-unsaturated carboxylic acid copolymers such as ethylene-isobutyl acrylate-methacrylic acid copolymer, and ethylene-n-butyl acrylate-methacrylic acid copolymer; and ionomers which are obtained by partially or entirely neutralizing carboxylic group of the above-mentioned ethylene-unsaturated carboxylate-unsaturated carboxylic acid copolymer; and ethylene-vinyl ester copolymers such as ethylene-vinyl acetate copolymer.

Among the above examples, ethylene-vinyl acetate copolymer (EVA) is most preferable as the ethylene-polar monomer copolymer. A sealing film having excellent transparency and adhesive property is obtained by using the copolymer.

The vinyl acetate content in the ethylene-vinyl acetate copolymer is in the range of 20 to 30 parts by weight, and particularly in the range of 24 to 28 parts by weight, based on 100 parts by weight of ethylene-vinyl acetate copolymer. When the vinyl acetate content is less than 20 parts by weight, it is possible that transparency of the sealing film becomes insufficient after the sealing film is crosslinked and cured at a high temperature. Further, when the vinyl acetate content exceeds 30 parts by weight, it is possible that bubbles are generated at the interface between the sealing film and the protective member in the solar cell.

(Crosslinking Agent)

As a crosslinking agent for the sealing film of the present invention, it is preferable to use an organic peroxide or an photo polymerization initiator. It is possible to prepare a cured/crosslinked film of the ethylene-polar monomer copolymer by use of the crosslinking agent. By using the cured film, the sealing property of a solar cell is increased. A sealing film having improved adhesive property, transparency, moisture resistance and temperature dependency of penetration property is obtained. For this reason, it is preferable to use an organic peroxide.

It is possible to use any organic peroxide as long as the organic peroxide decomposes at a temperature of 100° C. or more to generate radicals. Generally speaking, an organic peroxide to be used is selected, with the film forming temperature, conditions for formulating the composition, curing temperature, heat resistance of the adhesion substrate, and storage stability taking into account. In particular, it is preferable to use a material having a decomposition temperature of 70° C. or more in a 10-hour half-life time.

As the above-discussed organic peroxide, 2,5-dimethylhexane, 2,5-dihydroperoxide, 2,5-dimethyl-2,5-di(tert-butylperoxy)hexane, 3-di-tert-butylperoxide, tert-dicumylperoxide, 2,5-dimethyl-2,5-di(2-ethylhexanoylperoxy)hexane, 2,5-dimethyl-2,5-di(tert-butylperoxy)hexane, 2,5-dimethyl-2,5-di(tert-butylperoxy)hexine, dicumylperoxide, tert-butylcumylperoxide, α,α'-bis(tert-butyloxyisopropyl)benzene, α,α'-butyl-4,4-bis(tert-butylperoxy)diisopropylbenzene, n-butyl-4,4-bis(tert-butylperoxy)butane, 2,2-bis(tert-butylperoxy)butane, 1,1-bis(tert-butylperoxy)cyclohexane, 1,1-bis(tert-butylperoxy)3,3,5-trimethylcyclohexane, tert-butylperoxybenzoate, benzoylperoxide, and 1,1-di(tert-hexylperoxy)-3,3,5-trimethylcyclohexane are used, from the view point of process temperature and storage stability of the resin, are.

As the organic peroxide, it is particularly preferable to use 2,5-dimethyl-2,5-di(2-ethylhexanoylperoxy)hexane, and 1,1-di(tert-hexylperoxy)-3,3,5-trimethylcyclohexane. By use of these organic peroxides, a sealing film having an excellent adhesive property can be obtained.

The content of the organic peroxide as the crosslinking agent in the sealing film is preferably in the range of 0.1 to 5 parts by weight, more preferably in the range of 0.2 to 1.5 parts by weight, based on 100 parts by weight of ethylene-polar monomer copolymer. When the content of the organic peroxide is smaller than in the above range, it is possible that the transparency of the sealing film is decreased. While when the content of the organic peroxide is larger than in the above range, it is possible that bubbles are generated from reaction gas of the crosslinking agent.

Any known photopolymerization initiators can be used in the present invention. It is preferable that a polymerization initiator is used which imparts an excellent storage property to the sealing film after blending. Examples of the photopolymerization initiators include acetophenone type initiators such as 2-hydroxy-2-methyl-1-phenylpropane-1-on, 1-hydroxycyclohexylphenylketone and 2-methyl-1-[4-(methylthio)phenyl]-2-morphorinopropane-1; benzoin type initiators such as benzylmethylketal; benzophenone type initiators such as benzophenone, 4-phenylbenzophenone and hydroxybenzophenone; and thioxanthone type initiators such as isopropylthioxanthone and 2,4-diethythioxanthone. Further, as special type, methylphenylglyoxylate can be used. Especially preferred initiators are 2-hydroxy-2-methyl-1-phenylpropan-1-on, 1-hydroxycyclohexylphenylketone, 2-methyl-1-[4-(methylthio)phenyl]-2-morphorinopropane-1 and benzophenone. These photopolymerization initiators can be employed, if desired, together with one or more kinds of conventional photopolymerization promoter such as a benzoic acid type promoter (e.g., 4-dimethylaminobenzoic acid) or a tertiary amine type promoter by mixing these with the initiator at an optional mixing ratio. Only the photopolymerization initiator can be used alone or in combination of two or more kinds.

It is preferable that the content of the photopolymerization initiator in the sealing film of the invention is in the range of 0.5 to 5.0 parts by weight, based on 100 parts by weight of ethylene-polar monomer copolymer.

(Inorganic Filler)

Any inorganic filler which imparts an additional function to the sealing film can be used without any limitation, for the sealing film of the present invention.

Various inorganic fillers such as white, black, blue, red and other inorganic pigments can be used as the inorganic filler, e.g., for improving power generation capability of the solar cells by improving the efficiency for using light. Among the above-mentioned pigments, titanium oxide, calcium carbonate, zinc oxide, white lead, litopon, barite, precipitated barium sulfate, and calcium sulfate are preferably used, by which the incident light is used to enhance greatly the efficiency of the solar cell.

In addition to the above-discussed fillers, an inorganic acid acceptor comprising metal oxide, metal hydroxide, metal carbonate, or multi-metal hydroxide can be used as the inorganic filler, for preventing internal parts of solar cell from metal corrosion.

Specific examples of the organic acid acceptor are oxides, hydroxides, carbonate, carboxylate, silicates, borates, phosphites, metaborates of metal of group II in the periodic table of element such as magnesium oxide, calcium oxide, magnesium hydroxide, calcium hydroxide, barium hydroxide, magnesium carbonate, barium carbonate, calcium carbonate, calcium borate, zinc stearate, calcium phthalate, calcium phosphite, zinc oxide, calcium silicate, magnesium silicate, magnesium borate, magnesium meth-borate, and calcium metaborate, barium metaborate; oxides, basic carbonate, basic carboxylate, basic phosphites, and basic sulfite of group XIV in the periodic table of elements such as tin oxide, basic tin carbonate, tin stearate, basic tin phosphite, basic tin sulfite, lead saline oxide, silicon oxides, and silicon stearate; zinc oxide, aluminum oxide, aluminum hydroxide, iron hydroxide, and multi-metal hydroxides such as hydrotalcite; and aluminum hydroxide gel compound.

It is possible to use an inorganic filler in the form of plates, such as talc, clay and mica, for improving the mechanical strength of the sealing film for the solar cell to be obtained.

The mean particle diameter of the inorganic filler is preferably in the range of 1 nm to 5 μm, in particular in the range of 0.1 to 2.5 μm. If the mean particle diameter of the inorganic filler is too large, it is possible that a sealing film with a sufficient adhesive property cannot be obtained. On the other hand, when the mean particle diameter of the inorganic filler is too small, the inorganic fillers easily agglomerate, and are difficult to be highly dispersed.

In the present invention, the mean particle diameter of the inorganic fillers is obtained as follows: The sealing film of the solar cell is observed by an electron microscope (preferably a transmission electron microscope) with a magnitude of about 1,000,000, and obtaining equivalent circle diameters of projected area, with respect to at least 100 particles of the inorganic filler. Then, the average value of the particle diameters is obtained, as the mean particle diameter.

The content of the above-mentioned inorganic filler is preferably in the range of 0.01 to 10 parts by weight, and in particular in the range of 0.1 to 5 parts by weight, based on 100 parts by weight of the ethylene-polar monomer copolymer. Accordingly, it is possible to highly disperse the inorganic filler so that a sealing film having an excellent adhesive property can be obtained.

(Crosslinking Auxiliary Agent)

The sealing film for a solar cell of the invention preferably contains a crosslinking auxiliary agent. The crosslinking auxiliary agent improves gel fraction of ethylene-polar monomer copolymer and adhesive property and durability of the sealing film.

The crosslinking auxiliary agent is generally used in an amount of 10 parts by weight or less, preferably in the range of 0.1 to 5 parts by weight, based on 100 parts by weight of ethylene-vinyl acetate copolymer. Accordingly, a sealing film with an excellent adhesive property can be obtained.

Examples of the above-mentioned crosslinking auxiliary agent (a compound having a free radical polymerization group) include tri-functional crosslinking auxiliary agents such as triallyl cyanurate and triallyl isocyanurate; and mono- or di-functional crosslinking auxiliary agents such as (meth) acrylic esters (e.g., NK esters). Among these compounds, triallyl cyanurate and triallyl isocyanurate are preferably used, and triallyl isocyanurate is particularly preferably used.

(Others)

In order to improve or adjust various physical properties (mechanical strength, adhesive property, optical properties such as transparency, heat resistance, light resistance, and crosslinking rate, etc), particularly in order to improve mechanical strength of the sealing film of the invention, it is possible, if necessary, that the sealing film of the present invention further includes additives such as a plasticizer, an adhesion promoter, an acryloxy-group-containing compound, a methacryloxy-group-containing compound and/or an epoxy-group-containing compound.

Generally speaking, polybasic acid esters and polyhydric alcohol esters are used as the above mentioned plasticizer, although there is no special restrictions to the plasticizer to be used. Examples of the plasticizer include dioctyl phthalate, dihexyladipate, triethylene glycol-di-2-ethylbutylate, butyl sebacate, tetraethylene glycol heptanoate and triethylene glycol dipelargonate. The plasticizer can be used singly, or in combination of two or more kinds. The plasticizer is used preferably in an amount of not more than 5 parts by weight, based on 100 parts by weight of ethylene-polar monomer copolymer.

As the adhesion promoter, a silane coupling agent can be used. By using the silane coupling agent, a sealing film for a solar cell having an excellent adhesive property can be obtained. Examples of the silane coupling agent include γ-chloropropylmethoxysilane, vinylethoxysilane, vinyltris(β-methoxyethoxy)silane, γ-methacryloxypropyltrimethoxysilane, vinyltriacetoxysilane, γ-glycidoxypropyltrimethoxysilane, γ-glycidoxypropyltriethoxysilane, β-(3,4-epoxycyclohexyl)ethyltrimethoxysilane, vinyltrichloroslane, γ-mercaptopropyltrimethoxysilane, γ-aminopropyltriethoxysilane, and N-β-(aminoethyl)-γ-aminopropyltrimethoxysilane. These silane coupling agents can be used alone or as a combination of two or more. The content of the silane coupling agent is preferably not more than 5 parts by weight, based on 100 parts by weight of ethylene-polar monomer copolymer.

Generally speaking, acrylic acid or methacrylic acid derivatives, for instance, esters or amides of acrylic acid or methacrylic acid are used, as the above-mentioned acryloxy-group containing compound and the methacryloxy-group containing compound. Examples of the ester residue are straight-chain alkyl groups, such as methyl, ethyl, dodecyl, stearyl, lauryl, and cyclohexyl group, tetrahydrofurfuryl group, amino ethyl group, 2-hydroxyethyl group, 3-hydroxypropyl group, and 3-chloro-2-hydroxypropyl group. Examples of the amide are diacetone acrylamide. Further, it is possible to use esters obtained from a polyhydric alcohol such as ethylene glycol, triethylene glycol, polypropylene glycol, polyethylene glycol, triemthylol propane, or pentaerythritol and acrylic acid or methacrylic acid.

As the afore-mentioned epoxy-group-containing compound, triglycidyl tris(2-hydroxyethyl)isocyanurate, neopentylglycol diglycidyl ether, 1,6-hexanediol diglycidyl ether, allyl glycidyl ether, 2-ethylhexyl glycidyl ether, phenyl glycidyl ether, phenol(ethyleneoxy)$_5$glycidyl ether, p-tert-butylphenyl glycidyl ether, diglycidyl adipate, diglycidyl phthalate, glycidyl methacrylate and butyl glycidyl ether can be used.

The acryloxy group-containing compound, methacryloxy group-containing compound or epoxy group-containing compound is preferably contained in an amount of 0.5 to 5.0 parts by weight, and preferably 1.0 to 4.0 parts by weight, based on 100 parts by weight of ethylene-polar monomer copolymer.

Further, the sealing film of the present invention may further contain ultraviolet absorber, light stabilizer, and/or anti-aging agent.

By adding the ultraviolet absorber to the sealing film for a solar cell of the invention, it is possible to prevent ethylene-polar monomer copolymer from being deteriorated by the effect of light irradiation or the like, and the sealing film for a solar cell from yellowing. There is no particular restrictions to the ultraviolet absorber to be used in the present invention. Preferable examples of the ultraviolet absorber are benzophenone-based ultraviolet absorbers such as 2-hydroxy-4-methoxybenzophenone, 2-hydroxy-4-n-dodecyloxybenzophenone, 2,4-dihydroxybenzophenone, 2,2'-dihydroxy-4-methoxybenzophenone, 2-hydroxy-4-n-octoxybanzophenone. Moreover, the benzophenone-based ultraviolet absorber preferably in an amount of 0.01 to 5 parts by weight is added based on 100 parts by weight of ethylene-polar monomer copolymer.

It is also possible, by adding the photostabilizer to the sealing film for a solar cell of the invention, to prevent ethylene-polar monomer copolymer from being deteriorated by the effect of light irradiation or the like, and the sealing film from yellowing. A hindered amine photostabilizer can be used as the photostabilizer. Examples of the photostabilizer include LA-52, LA-57, LA-62, LA-63, LA-63p, LA-67 and LA-68 (each manufactured by ADEKA Co., Ltd.), Tinuvin 744, Tinuvin 770, Tinuvin 765, Tinuvin 144, Tinuvin 622LD, and CHIMASSORB 944LD (each manufactured by Ciba Specialty Chemicals Co., Ltd.), and UV-3034 (each manufactured by B. F. Goodrich). The photostabilizers can be each used singly, or in combination of two or more kinds. The blend content of the photostabilizer preferably is in the range of 0.01 to 5 parts by weight based on 100 parts by weight of ethylene-polar monomer copolymer.

Examples of the anti-aging agent are hindered phenol antioxidants such as N,N'-hexan-1,6-diyl-bis[3-(3,5-di-tert-butyl-4-hydroxyphenyl)propionamide], phosphorus-type heat stabilizers, lactone-type heat stabilizers, vitamin E-type heat stabilizers and sulfur-type heat stabilizers.

It is possible that the sealing film for a solar cell of the invention is prepared in accordance with a conventional film forming method. For instance, the composition including the above-discussed materials is molded into a sheet-shaped article by extrusion molding, or calendar molding (calendaring). Alternatively, the composition is dissolved in a solvent, the thus obtained solution is applied to an appropriate substrate by an appropriate coater, and the applied solution is dried to obtain a coat. Thus, a sheet-shaped article can be prepared. The heat application temperature is generally in the range of 50 to 90, when a film is formed, e.g. by application of heat and pressure by use of rollers in accordance with extrusion molding.

The thickness of the sealing film for a solar cell of the invention does not have any particular restriction, and is possible to be in the range of 50 µm to 2 mm.

The structure of the solar cell obtained by use of the sealing film of the present invention does not have any particular restriction. It is possible that the photovoltaic cell is sealed by interposing the sealing film(s) between the front side transparent protection member and the back side protection member, and that the sealing film(s) is/are crosslinked so as to be integral with the other members/layers.

For sufficiently sealing the photovoltaic cell in the solar cell, the front side transparent protection member 11, front side sealing film 13A, photovoltaic cell(s) 14, back side sealing film 13B and back side protection member 12 are successively overlaid as shown in FIG. 1. Thereafter, the sealing film is crosslinked/cured in accordance with a conventional method such as heat and pressure application.

The thus obtained laminate is subjected to heat and pressure application at a temperature of 135 to 180° C., more preferably 140 to 180° C., in particular 155 to 180° C., by using a vacuum laminator with a degassing time of 0.1 to 5 minutes, a pressure of 0.1 to 1.5 kg/cm$^2$, and a press time of 5 to 15 minutes. When the heat and pressure application is carried out, ethylene-vinyl acetate copolymer included in the front side sealing film 13A and the back side sealing film 13B is crosslinked. Accordingly, the front side transparent protection member 11, back side transparent member 12 and photovoltaic cell 14 are integrated with each other via the front side sealing film 13A and the back side sealing film 13B. Thus, the photovoltaic cell 14 can be sealed.

The sealing film for a solar cell of the invention is particularly preferably used as the back side sealing film to be provided between the photovoltaic cell and the back side protective member, since the sealing film includes the inorganic filler.

In the present invention, a side of a photovoltaic cell from which the light is irradiated is referred to as "front side", and a reversed side, with respect to the light-receipt side, of photovoltaic cell is referred to as "bask side".

The front side transparent protection member of the solar cell of the invention is usually a glass substrate such as silicate glass. The thickness of the glass substrate is generally in the range of 0.1 to 10 mm, preferably 0.3 to 5 mm. The glass plate can be thermally or chemically tempered.

The back side protection member for use in the present invention is a plastic film such as PET. With heat resistance and moisture resistance taking into account, a laminate film including fluorinated polyethylene film, in particular fluorinated polyethylene film, Al film, and fluorinated polyethylene film in this order is preferable. It is preferable that the sealing film of the present invention is used for a solar cell which has a plastic film such as a PET film as the back side protection member, since the plastic film such as PET has a low adhesive property with respect to a sealing film for a solar cell.

The solar cell of the present invention is characterized by the sealing films used as the front side and the back side films. Namely, there is no particular restriction on the members of the solar cell except for the sealing films. In other words, the front side transparent protection member, back side protection member, and photovoltaic cells can have structures/compositions as those in known solar cells.

EXAMPLES

The present invention will now be explained by referring to Examples. The present invention is not restricted to the examples below.

Example 1

Materials with the formulation in Table 1 were supplied to a roll mill, and kneaded at 70° C. to prepare a composition for a sealing film for a solar cell. The composition for a sealing film was formed by calendaring at a temperature of 70° C. After the formed composition was allowed to cool, a sealing film (thickness: 0.6 mm) for a solar cell was obtained.

Examples 2 to 5 and Comparative Example 1

Compositions for sealing films were prepared in the same way as in Example 1, except that the materials and the formulations are changed into those in Table 1. By using these compositions, sealing films for solar cells were prepared.

Comparative Examples 2 to 5

Compositions for sealing films were prepared in the same way as in Example 1, except that the materials and the formulations are changed into those in Table 2. By using these compositions, sealing films for solar cells were prepared.
[Evaluation of Adhesive Properties]

The adhesive properties of the sealing films prepared as discussed above, with respect to a PET film, were evaluated, in accordance with 180° peel test (JIS K 6584, 1994). 180° peel test was carried out in the following procedure as shown in FIG. 2.

The sealing film 23 for a solar cell and PET film 22 (thickness: 50 mm, width: 10 cm) are superimposed on the glass substrate 21 in this order. The thus obtained laminate was subjected to vacuum degassing by using a vacuum laminator, and preliminary pressure contact treatment at a temperature of 100° C. Subsequently, the laminate was brought into an oven, and treated by application of pressure and heat thereto for 4 minutes, under a condition at a temperature of 155° C. Thereafter, the laminate was left in an atmosphere of 23° C. and 50% RH for 24 hours. Then, the sealing film 23 and the PET film 22 were partially released from the glass substrate. The released part of the PET film 22 was folded by 180° turn. By using a tensile tester (Autograph, manufactured by Shimadzu Corporation), peal strength at a tensile speed of 100 mm/min was measured, as PET adhesion strength (N/cm). The results are shown in Tables 1 and 2.

TABLE 1

| | | Ex. 1 | Ex. 2 | Ex. 3 | Ex. 4 | Ex. 5 | Comp. Ex. 1 |
|---|---|---|---|---|---|---|---|
| Formulation (parts by weight) | EVA*[1] | 100 | 100 | 100 | 100 | 100 | 100 |
| | Crosslinking agent*[2] | 1.3 | 1.3 | 1.3 | 1.3 | 1.3 | 1.3 |
| | Crosslinking auxiliary agent*[3] | 2 | 2 | 2 | 2 | 2 | 2 |
| | White inorganic pigment*[4] | 4.2 | 4.2 | 4.2 | 4.2 | 4.2 | 4.2 |
| | Phosphite compound (1)*[5] | 0.1 | 0.2 | 0.3 | 0 | 0 | 0 |
| | Phosphite compound (2)*[6] | 0 | 0 | 0 | 0.05 | 0.1 | 0 |
| PET Adhesion Strength [N/cm] | | 24.0 | 26.4 | 26.0 | 21.1 | 25.2 | 8.1 |

Note)
*[1]The content of vinyl acetate is 25 parts by weight, based on 100 parts by weight of EVA
*[2]2,5-dimethyl-2,5-di(2-ethylhexanoylperoxy)hexane
*[3]triallyl isocyanurate
*[4]titanium oxide (mean particle diameter: 1 μm)
*[5]trisisodecyl phosphite
*[6]tris(nonylphenyl) phosphite

TABLE 2

| | | Comp. Ex. 2 | Comp. Ex. 3 | Comp. Ex. 4 | Comp. Ex. 5 |
|---|---|---|---|---|---|
| Formulation (parts by weight) | EVA*[1] | 100 | 100 | 100 | 100 |
| | Crosslinking agent*[2] | 1.3 | 1.3 | 1.3 | 1.3 |
| | Crosslinking auxiliary agent*[3] | 2 | 2 | 2 | 2 |
| | White inorganic pigment*[4] | 4.2 | 4.2 | 4.2 | 4.2 |
| | Phosphite compound (3)*[7] | 0.1 | 0.3 | 0 | 0 |
| | Phosphite compound (4)*[8] | 0 | 0 | 0.1 | 0.3 |
| PET Adhesion Strength [N/cm] | | 3.1 | 7.5 | 2.1 | 4.1 |

Note)
*[1]The content of vinyl acetate is 25 parts by weight, based on 100 parts by weight of EVA
*[2]2,5-dimethyl-2,5-di(2-ethylhexanoylperoxy)hexane
*[3]triallyl isocyanurate
*[4]titanium oxide (mean particle diameter: 1 μm)
*[7]dioleyl hydrogen phosphite
*[8]di-2-ethylhexyl hydrogen phosphite As shown in Tables 1 and 2, it can be seen that the sealing films of the invention, which comprise the tertiary phosphite compound of the present invention, have excellent adhesive properties. Therefore, it is possible to prevent the solar cell from bubble formation at the interface between the sealing film and the protection member, and the layers from being peeled from each other. In the present invention, a solar cell is provided, which maintains an high power generation performance for a long time, from the time of installation.

The invention claimed is:

1. A sealing film for a solar cell, comprising:
ethylene-vinyl acetate copolymer;
a crosslinking agent selected from the group consisting of 2,5-dimethylhexane-2,5-dihydroperoxide, 2,5-dimethyl-2,5-di(tert-butylperoxy)hexane, di-tert-butylperoxide, 2,5-dimethyl-2,5-di(2-ethylhexanoylperoxy)hexane, 2,5-dimethyl-2,5-di(tert-butylperoxy)hexyne, dicumylperoxide, tert-butylcumylperoxide, α,α'-bis(tert-butyloxyisopropyl)benzene, α,α'-butyl-4,4-bis(tert-butylperoxy)diisopropylbenzene, 2,2-bis(tert-butylperoxy)butane, 1,1-bis(tert-butylperoxy)cyclohexane, 1,1-bis(tert-butylperoxy)-3,3,5-trimethylcyclohexane, tert-butylperoxybenzoate, benzoylperoxide, and 1,1-di(tert-hexylperoxy)-3,3,5-trimethylcyclohexane in an amount of 0.1 to 5 parts by weight, based on 100 parts by weight of the ethylene-vinyl acetate copolymer,
titanium oxide in an amount of 0.1 to 5 parts by weight, based on 100 parts by weight of the ethylene-vinyl acetate copolymer, and
trisisodecyl phosphite in an amount of 0.2 to 0.3 parts by weight, based on 100 parts by weight of the ethylene-vinyl acetate copolymer.

2. The sealing film for a solar cell as defined in claim 1, wherein the vinyl acetate content in the ethylene-vinyl acetate copolymer is in the range of 20 to 30 parts by weight, based on 100 parts by weight of the ethylene-vinyl acetate copolymer.

3. The sealing film for a solar cell as defined in claim 1, wherein titanium oxide has a mean particle diameter in the range of 1 nm to 5 μm.

4. The sealing film for a solar cell as defined in claim 1, further comprising a crosslinking auxiliary agent.

5. The sealing film for a solar cell as defined in claim 4, wherein the crosslinking auxiliary agent is contained in an amount in the range of 0.1 to 5 parts by weight, based on 100 parts by weight of ethylene-vinyl acetate copolymer.

6. The sealing film for a solar cell as defined in claim 4, wherein the crosslinking auxiliary agent is triallyl isocyanurate.

7. The sealing film for a solar cell as defined in claim 1, wherein the crosslinking agent is selected from the group consisting of 2,5-dimethyl-2,5-di(2-ethylhexanoylperoxy) hexane and 1,1-di(tert-hexylperoxy)-3,3,5-trimethylcyclohexane.

8. The sealing film for a solar cell as defined in claim 1, wherein titanium oxide is used in an amount of 4.2 to 5 parts by weight, based on 100 parts by weight of the ethylene-vinyl acetate copolymer.

9. A solar cell comprising:
a front side transparent protection member,
a back side protection member,
a sealing film comprising:
ethylene-vinyl acetate copolymer;
a crosslinking agent selected from the group consisting of 2,5-dimethylhexane-2,5-dihydroperoxide, 2,5-dimethyl-2,5-di(tert-butylperoxy)hexane, di-tert-butylperoxide, 2,5-dimethyl-2,5-di(2-ethylhexanoylperoxy)hexane, 2,5-dimethyl-2,5-di(tert-butylperoxy)hexyne, dicumylperoxide, tert-butylcumylperoxide, α,α'-bis(tert-butyloxyisopropyl)benzene, α,α'-butyl-4,4-bis(tert-butylperoxy)diisopropylbenzene, 2,2-bis(tert-butylperoxy)butane, 1,1-bis(tert-butylperoxy)cyclohexane, 1,1-bis(tert-butylperoxy)-3,3,5-trimethylcyclohexane, tert-butylperoxybenzoate, benzoylperoxide, and 1,1-di(tert-hexylperoxy)-3,3,5-trimethylcyclohexane in an amount of 0.1 to 5 parts by weight, based on 100 parts by weight of the ethylene-vinyl acetate copolymer,
titanium oxide in an amount of 0.1 to 5 parts by weight, based on 100 parts by weight of the ethylene-vinyl acetate copolymer, and
trisisodecyl phosphite in an amount of 0.2 to 0.3 parts by weight, based on 100 parts by weight of the ethylene-vinyl acetate copolymer,
the sealing film being provided between the front side transparent protection member and the back side protection member, and
photovoltaic cells sealed between the front side transparent protection member and the back side protection member, the sealing film being crosslinked to be integral with the photovoltaic cells.

* * * * *